United States Patent
Laughery et al.

(10) Patent No.: US 10,677,853 B2
(45) Date of Patent: Jun. 9, 2020

(54) SYSTEM AND METHOD FOR DETERMINING AN AMOUNT OF DEGRADATION OF A MEDICAL DEVICE BATTERY

(71) Applicant: Stryker Corporation, Kalamazoo, MI (US)

(72) Inventors: Sean Christopher Laughery, Vicksburg, MI (US); Andrew William Esper, Kalamazoo, MI (US)

(73) Assignee: Stryker Corporation, Kalamazoo, MI (US)

( * ) Notice: Subject to any disclaimer, the term of this patent is extended or adjusted under 35 U.S.C. 154(b) by 15 days.

(21) Appl. No.: 16/015,953

(22) Filed: Jun. 22, 2018

(65) Prior Publication Data
US 2018/0372806 A1    Dec. 27, 2018

Related U.S. Application Data

(60) Provisional application No. 62/523,494, filed on Jun. 22, 2017.

(51) Int. Cl.
| | |
|---|---|
| *H02J 7/00* | (2006.01) |
| *G01R 31/392* | (2019.01) |
| *H01M 10/052* | (2010.01) |
| *H01M 10/44* | (2006.01) |
| *H01M 10/48* | (2006.01) |

(Continued)

(52) U.S. Cl.
CPC ....... *G01R 31/392* (2019.01); *G01R 31/3648* (2013.01); *G01R 31/378* (2019.01); *H01M 10/052* (2013.01); *H01M 10/425* (2013.01); *H01M 10/44* (2013.01); *H01M 10/48* (2013.01); *H02J 7/00* (2013.01); *H02J 7/007* (2013.01); *H01M 2010/4271* (2013.01); *H02J 7/0047* (2013.01); *H02J 7/025* (2013.01)

(58) Field of Classification Search
CPC ........ H02J 7/025; H01F 38/14; Y02T 90/122; B60L 11/182; Y02E 60/12
USPC .......................................................... 320/108
See application file for complete search history.

(56) References Cited

U.S. PATENT DOCUMENTS

| | | | |
|---|---|---|---|
| 6,018,227 A | 1/2000 | Kumar et al. | |
| 6,184,655 B1 | 2/2001 | Malackowski | |

(Continued)

FOREIGN PATENT DOCUMENTS

| | | |
|---|---|---|
| WO | 2007050439 A2 | 5/2007 |
| WO | 2007090025 A1 | 8/2007 |
| WO | 2017112485 A1 | 6/2017 |

*Primary Examiner* — Arun C Williams
(74) *Attorney, Agent, or Firm* — Howard & Howard Attorneys PLLC

(57) ABSTRACT

A method, a battery, and a system determine an amount of degradation of the battery. The method includes providing an autoclaveable lithium battery for a medical device, receiving a charging signal from a charging device, and initiating a charging cycle to charge a cell of the battery based on the charging signal. The charging cycle includes a constant current phase and a constant voltage phase. The method also includes monitoring a current provided to the cell during at least a portion of the constant voltage phase, calculating a current taper time based on the current provided during the constant voltage phase, and determining an amount of degradation of the battery based on the current taper time.

17 Claims, 10 Drawing Sheets

(51) Int. Cl.
 H01M 10/42 (2006.01)
 G01R 31/36 (2020.01)
 G01R 31/378 (2019.01)
 H02J 7/02 (2016.01)

(56) References Cited

U.S. PATENT DOCUMENTS

| | | |
|---|---|---|
| 7,705,559 B2 | 4/2010 | Powell et al. |
| 8,564,242 B2 | 10/2013 | Hansford et al. |
| 9,219,375 B2 | 12/2015 | Woods |
| 2006/0238203 A1* | 10/2006 | Kelley ................. G01R 31/389 324/433 |
| 2007/0090788 A1 | 4/2007 | Hansford et al. |
| 2009/0140691 A1* | 6/2009 | Jung ..................... H02J 7/0027 320/108 |
| 2014/0017118 A1* | 1/2014 | Stoddard ............. H01M 2/1094 422/1 |
| 2015/0182230 A1 | 7/2015 | Belagali et al. |

\* cited by examiner

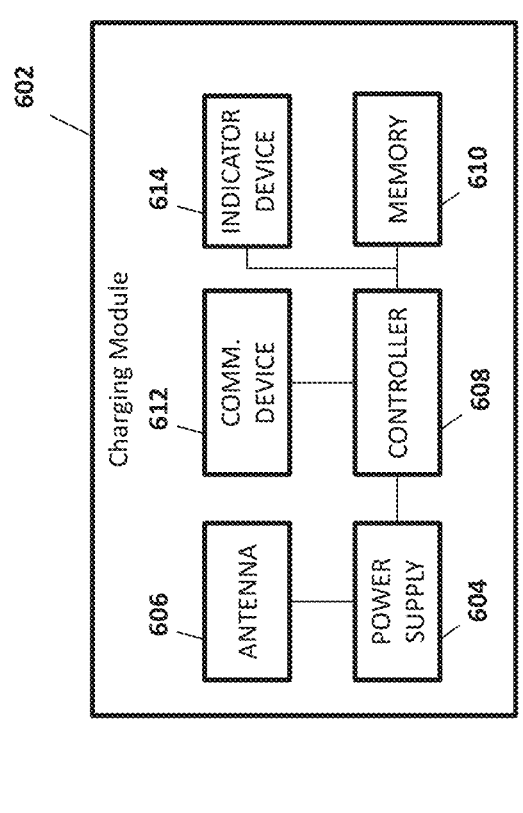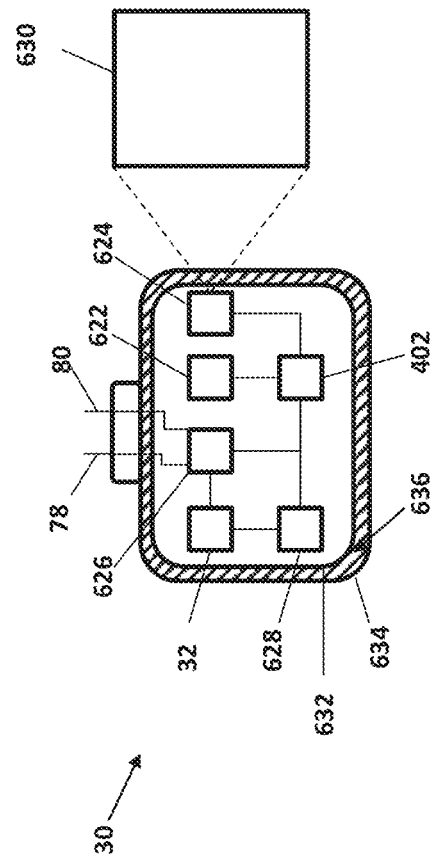
FIG. 6

SYSTEM AND METHOD FOR DETERMINING AN AMOUNT OF DEGRADATION OF A MEDICAL DEVICE BATTERY

RELATED APPLICATION

The present application claims the benefit of U.S. Provisional Patent Application No. 62/523,494, filed on Jun. 22, 2017, the entire disclosure of which is hereby incorporated by reference.

FIELD OF THE INVENTION

This disclosure relates generally to a battery for a medical device. More particularly, it relates to a system and method for determining an amount of degradation of a medical device battery. Also described are related systems and methods.

BACKGROUND

Non-rechargeable batteries are known as primary batteries while rechargeable batteries are known as secondary batteries. A secondary battery is capable of repeatedly being charged, storing the charge and delivering the charge to a medical device, such as a surgical tool, to which the battery is attached. Secondary batteries have, over the years, evolved into reliable power sources for powered surgical tools used in operating rooms to perform surgical procedures. The use of a battery eliminates the need to provide a power cord connected to an external power source. The elimination of the power cord offers benefits over corded surgical tools. Surgical personnel using this type of tool do not have to concern themselves with either sterilizing a cord so that it can be brought into the sterile surgical field surrounding the patient or ensuring that, during surgery, an unsterilized cord is not inadvertently introduced into the surgical field. Moreover, the elimination of the cord results in the removal of the physical clutter and field-of-view blockage the cord otherwise brings to a surgical procedure.

A secondary battery typically includes a housing and one or more rechargeable cells disposed in the housing. The cells are formed from material capable of storing electrical charge.

Batteries used to power surgical tools are exposed to adverse environmental elements to which batteries used for non-medical uses are seldom exposed. For example, during a surgical procedure, a medical battery may be exposed to blood or other body fluid. Tissue removed from the patient may adhere to the battery. While not an intended part of any procedure, the battery may be exposed to a saline solution. To eliminate the risk of patients being infected during the course of the medical procedure, it is therefore standard practice to sterilize the battery between surgical procedures. This cleaning/sterilization process typically involves rinsing the battery to remove contaminates that are readily visible on the surface of the battery. However, these events may cause a conductive bridge to form between the battery contacts, which can lead to the formation of a layer of metal oxide on one or more of the contacts. This oxide layer functions as an impedance layer that reduces the efficiency of both the charging of the battery and the efficiency of the battery to deliver charge to the tool to which the battery is coupled.

The batteries may also be subjected to immersion in a steam-filled chamber as part of an autoclaving process. To survive the high temperatures present during the autoclaving process, specialized batteries must be used. Autoclave temperatures often exceed 130 degrees centigrade. Even with specialized batteries that are designed to withstand autoclave temperatures, damage may still occur to the batteries during the autoclave process (although less damage than would occur with conventional batteries used in other environments). As a result, batteries used in medical environments that are subjected to autoclaving may sustain more damage than batteries used in other industries.

SUMMARY

In one embodiment, a method of determining a degradation amount of an autoclaveable battery for a medical device is disclosed. The method includes providing an autoclaveable battery for a medical device, receiving a charging signal from a charging device, and initiating a charging cycle to charge a cell of the battery based on the charging signal. The charging cycle includes a constant current phase and a constant voltage phase. The method also includes monitoring a current provided to the cell during at least a portion of the constant voltage phase, calculating a current taper time based on the current provided during the constant voltage phase, and determining an amount of degradation of the battery based on the current taper time.

In another embodiment, an autoclaveable battery for a medical device is disclosed. The battery includes a cell for storing a charge and a charging circuit configured to receive a charging signal from a charging device and to responsively initiate a charging cycle to charge the cell. The charging cycle includes a constant current phase and a constant voltage phase. The battery also includes a battery controller coupled to the charging circuit. The battery controller is configured to monitor a current provided to the cell during at least a portion of the constant voltage phase, calculate a current taper time based on the current provided during the constant voltage phase, and determine an amount of degradation of the battery based on the current taper time.

In yet another embodiment, a system includes an autoclaveable battery for a medical device and a module for charging the battery. The module includes a processor and a transmission component configured to provide a charging signal to the battery. The battery includes a cell for storing a charge, a charging circuit configured to receive the charging signal from the module, and to responsively initiate a charging cycle to charge the cell. The charging cycle includes a constant current phase and a constant voltage phase. The battery also includes a battery controller coupled to the charging circuit. The battery controller is configured to monitor a current provided to the cell during at least a portion of the constant voltage phase. One of the module processor and the battery controller is configured to calculate a current taper time based on the current provided during the constant voltage phase, and determine an amount of degradation of the battery based on the current taper time.

BRIEF DESCRIPTION OF THE DRAWINGS

Advantages of the present disclosure will be readily appreciated, as the same becomes better understood by reference to the following detailed description, when considered in connection with the accompanying drawings. Non-limiting and non-exhaustive embodiments of the present disclosure are described with reference to the following figures, wherein like numerals refer to like parts throughout the various views unless otherwise specified.

FIG. 6 is a block diagram of a system including a wireless charging module and a battery;

DETAILED DESCRIPTION

Figure 1:
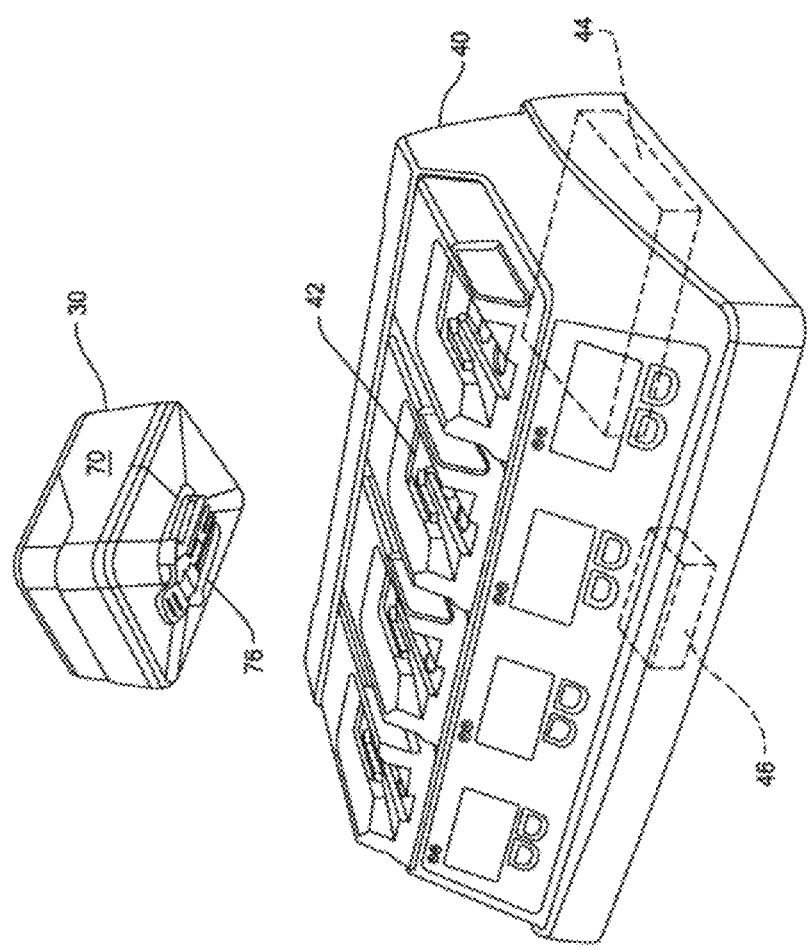
FIG. 1 is a perspective view of a battery and a charger.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an examples" means that a particular feature, structure or characteristic described in connection with the embodiment of example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

As used herein, the term "constant" refers to a substantially fixed amount or value that does not change more than a nominal amount. In one embodiment, the nominal amount is within 3% of the fixed amount or value. In another embodiment, the nominal amount is within 1% of the fixed amount or value.

The present disclosure particularly describes an autoclaveable battery that is capable of being charged by a wireless or wired charging module. The battery may transmit a charging request to the charging module using a battery communication device. In response to receiving the charging request, the charging module transmits a charging signal to the battery.

The battery may include a battery controller. The battery controller may initiate a charging cycle by controlling a charging circuit within the battery to initiate a constant current phase and a constant voltage phase. In the constant current phase, the charging circuit provides a constant current to the one or more battery cells while the voltage applied to the cells may vary. During the constant current phase, the battery cells are charged until a predetermined state of charge is reached for the cells. Alternatively, the constant current phase may continue until a predetermined amount of time has elapsed. After the constant current phase has completed, the charging circuit begins the constant voltage phase. In the constant voltage phase, the charging circuit provides a constant voltage to the one or more battery cells while the current applied to the cells may vary. During the constant voltage phase, the battery controller monitors the current provided to the cells. As the constant voltage phase progresses, the current provided to the cells may progressively decrease. The battery controller may record a time that the constant voltage stage began (a current taper start time) and a time that the current provided to the cells reaches or drops below a predetermined threshold (a current taper end time). The battery controller may calculate a current taper time by subtracting the current taper start time from the current taper end time. It should be appreciated that, in embodiments where the charging module includes a charger controller, the charger controller may also perform the steps necessary to calculate the current taper time. Furthermore, it should be appreciated that the current taper time may be determined with other suitable mathematical methods.

The battery controller may estimate or otherwise determine an amount of degradation that the battery has undergone based at least partially on the current taper time. In one embodiment, the battery controller may determine an amount of degradation to be high or otherwise unacceptable if the current taper time equals or exceeds a predetermined threshold. The threshold may be based on an amount of change from a baseline current taper time as described more fully herein. The baseline current taper time may be specific to each battery such that each battery may have a different baseline current taper time. The battery controller may determine the amount of degradation of the battery to be acceptable if the current taper time does not exceed the predetermined threshold. Additionally or alternatively, the battery controller (or another suitable controller) may determine a degradation rating or score of the battery based at least in part on the current taper time as described more fully herein. Furthermore, the charger controller may similarly determine the amount of degradation.

In contrast to existing methodologies, the embodiments described herein do not require the battery to undergo a separate, active battery test in which current is diverted through an external resistor (e.g., located within a charging device) to determine the impedance of the battery. Rather, the embodiments described herein provide a passive approach to monitoring battery degradation in that the battery controller monitors the current provided to the battery cells during a constant voltage stage of the battery charging cycle. Thus, the battery controller or the charger controller may determine an amount of battery degradation when no physical connection to an external resistor is provided, such as during a wireless charging cycle.

While the battery controller has been described as determining the amount of degradation of the battery, it should be recognized that a controller of the charging module or a controller of a wireless dongle attachable to the battery may determine the degradation of the battery in some embodiments.

With the foregoing summary in mind, additional details of the battery are described with reference to FIGS. 1-5. A medical device that may be used with the battery is described with reference to FIG. 2. A charging module that may be used to provide charge to the battery is described with reference to FIG. 6. A data structure for storing data relating to the battery and the charging cycle is described with reference to FIG. 7, while an attachment that may be used with the battery is described with reference to FIG. 8. An example charging cycle for the battery is described with reference to FIG. 9, while further details of the method for determining an amount of degradation of the battery are described with reference to FIG. 10.

FIG. 1 illustrates a battery 30 and a charger 40 according to an example embodiment. Internal to the battery are one or more rechargeable cells (shown in FIG. 3) capable of storing electrical charge. Charger 40 may have at least one socket 42 shaped to releasably hold the battery. Internal to the charger 40 is a power source, illustrated by phantom rectangular block 44. Also internal to the charger is a controller, illustrated by phantom rectangular block 46. When battery 30 is coupled to the charger, the power source 44 applies a charging current to the battery cells 32. Charger controller 46 regulates the charging of the battery by power source 44. The charger controller 46 also is capable of retrieving data from and writing data to memories internal to the battery 30. Various other charger configurations are contemplated. A further understanding of the charger 40 can be obtained from U.S. Pat. No. 8,564,242, entitled "BATTERY CHARGER CAPABLE OF PERFORMING A FULL OR PARTIAL STATE OF HEALTH EVALUATION OF THE BATTERY BASED ON THE HISTORY OF the BATTERY", the disclosure of which is incorporated herein by reference.

Figure 2:
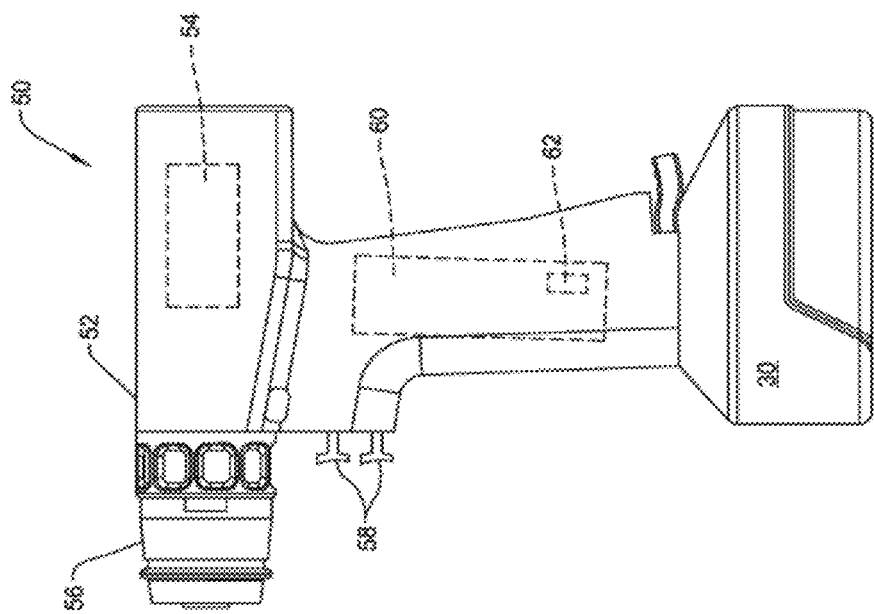
FIG. 2 is a plan view of the battery attached to a power consuming device.

FIG. 2 illustrates a power consuming medical device 50 coupled to the battery 30. As shown in FIG. 2, the medical device is a powered surgical tool 50 (sometimes referred to as a surgical handpiece) for performing a surgical procedure. In other embodiments, medical device 50 may be a tethered surgical headpiece, or may be any other instrument powered by battery 30 and that is otherwise adapted for use by medical professionals such as, without limitation, lights, cameras, speakers, microphones, sensors, and the like. For the purposes of clarity and consistency, subsequent description of the medical device 50 will generally be made with reference to the powered surgical tool, which is depicted throughout the drawings and which is described in greater detail below. Thus, unless otherwise indicated, the description of the various components and features of the surgical tool described herein also apply to other types of medical devices.

In the illustrated embodiment, tool 50 has a housing 52 that is pistol shaped. The aft end of the tool housing 52 is shaped to releasably receive the battery 30. A powered surgical tool includes a power generating component that converts the electrical energy drawn from the battery cells 32 into another form of energy useful for performing a medical or surgical procedure. In the illustrated embodiment, the power generating component is a motor represented by dashed rectangle 54. Many power surgical tools have a coupling assembly, represented by ring 56. The coupling assembly 56 releasably attaches an energy applicator to the power generating component. The energy applicator is the device that actually applies the energy output by the power generating unit to the target site where the medical procedure is being performed. If the power generating unit is a motor 54, the energy applicator may be what is referred to as a cutting accessory. For simplicity, the tool power generating component is below referred to as motor 54 even though other tools may have other power generating devices that draw current to function.

In the embodiment shown in FIG. 2, the medical device is a hand-held motorized surgical tool 50 that may be used to impart energy to a portion of a patient's anatomy. For example, the medical device may be a motorized bur, saw, or drill that may be used to cut or remove tissue from a target site in the patient's anatomy. Alternatively, the medical device may be a surgical helmet or headpiece as described in PCT Application Serial No. PCT/US16/66633 entitled "HEAD UNIT SYSTEM WITH CONNECTOR FOR PERIPHERAL DEVICE", the disclosure of which is hereby incorporated by reference in its entirety, or any other suitable device. Alternatively, the tool 50 may have a housing 52 that is pencil shaped as described in U.S. Pub. No. 2015/0182230 entitled "BATTERY AND CONTROL MODULE FOR BOTH ENERGIZING AND CONTROLLING A POWERED SURGICAL TOOL THAT IS RELEASABLY ATTACHED TO THE MODULE", the disclosure of which is hereby incorporated by reference in its entirety. The battery 30 may also share features with the battery described in U.S. Pub. No. 2015/0182230. The following embodiments will be described with the medical device being tool 50, with the understanding that the medical device is not thus limited.

Tool 50 also includes at least one manually actuatable control member. The depicted tool 50 has two triggers 58. The triggers 58 are depressed by the practitioner to regulate the actuation of the tool. Also internal to the tool is a control module 60. The control module 60 includes components that monitor the actuation of the triggers 58. Other components internal to the control module, in response to the actuation of the triggers 56, selectively couples the battery cells 32 to the tool motor 52. One of these other components internal to control module 58 is a tool processor 62.

Figure 3:
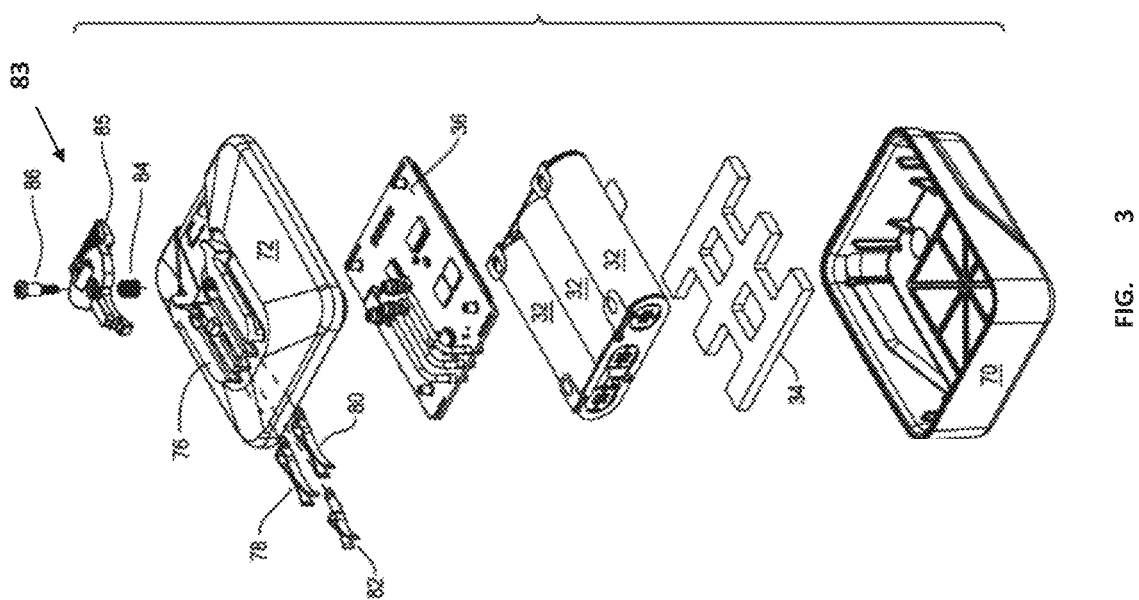
FIG. 3 is an exploded view of the battery.

As seen in FIG. 3, the example battery 30 includes a housing (not labeled in FIG. 3), which includes a shell 70 and a lid 72. The shell 70 includes a plurality of rechargeable cells 32 seated therein. In one embodiment, the cells 32 are connected together in series to form a cell cluster. The cell cluster is seated on a foam pad 34 disposed in the base of shell 70. A lid 72 is sealing disposed over the open top end of the shell 70. If the battery 30 is intended for medical/surgical use, the lid 72 may be attached to the shell 70 so the shell and lid collectively form an autoclaveable housing. The lid 72 is formed with a battery head 76. Battery head 76 is dimensioned to fit both in the charger socket 42 and against the aft end of the tool housing 52 such that the battery head 76 and the housing of the battery 30 may be releasably coupled to either the charger socket 42 or the butt end of the tool housing 52.

Furthermore, as shown in FIG. 3, the battery head 76 is provided with power contacts 78 and 80. Power contacts 78 and 80 are the conductive members through which the charger 40 applies a charging current to the cells 32 and from which the surgical tool 50 draws an energizing current and is provided with an operating voltage. Contact 78 is the cathode and contact 80 is the anode of the battery 30. Furthermore, as shown in FIG. 3, contacts 78 and 80 may be exposed and may be electrically connected to the charger socket 42 or to the medical device via the butt end of the tool housing 52.

Also shown in FIG. 3, in some embodiments, the example battery 30 may include an optional data contact 82. Similar to contacts 78 and 80, data contact 82 may also be exposed and may also be electrically connected to the charger socket 42 or to the medical device via the butt end of the tool housing 52. However, in embodiments including the data contact 82, the data contact 82 does not provide an operating voltage, but instead provides data and instruction signals, which are written into and read out from the battery 30 through data contact 82. The battery 30 may thus use the data contact 82 to exchange data and instructions with charger controller 46, tool processor 62, and processors of the modules. These signals may be exchanged between the various processors using any suitable wire communication protocol, such as a one-wire signal exchange protocol. One such protocol is the Dallas Semiconductor One-Wire protocol. However, it should be noted that, in other embodiments, data contact 82 may be omitted, and data and instructions may be written into and read out from battery 30 using a wireless communication device (described more fully herein). Accordingly, the battery 30 is free of a data contact.

The battery 30 and/or tool 50 may optionally include a latching system 83 to secure the battery to the tool. The latching system 83 may include a latch 85. The latch 85 may be pivotally mounted to the battery lid 72. The latch 85 holds the battery 30 to the butt end of tool housing 52. A pin 86 holds latch to the lid 72. A spring 84 biases one portion of the latch away from the adjacent surface of the lid 72.

Mounted to the cell cluster so as to be disposed between the cells 32 and lid 72 is a circuit board 36. Circuit board 36 holds the below described components that selectively couple cells 32 to the anode contact 80 and the cathode contact 78.

In example embodiments, cells 32 are lithium ion cells. For example, cells 32 may include any suitable nickel or lithium chemistry cell, including but not limited to, lithium ion ceramic cells, lithium iron phosphate, lithium iron phosphorous oxynitride cells, or lithium tin phosphorous sulfide cells. In alternative embodiments, cells 32 may be lead acid, or any other suitable type of cell. Each cell, when properly charged, has a nominal cell voltage of 3.3 VDC. In many, but not all embodiments, the cells are connected together in series. In the illustrated embodiment, battery 30 includes 3 series connected cells 32. This version of battery 30 is therefore configured to output a potential of around 9.9 VDC. Alternatively, in some embodiments, at least some of the battery cells may be connected together in parallel.

The physical structure of the battery may also be different from what is described and illustrated. For example, one or more of the contacts 78 and 80 may be mounted directly to the housing as opposed to the lid 72. Likewise, the circuit board 36 that holds the electrical components internal to the battery 30 may be mounted to the housing or lid 72 instead of being mounted to the cell cluster.

Figure 4:
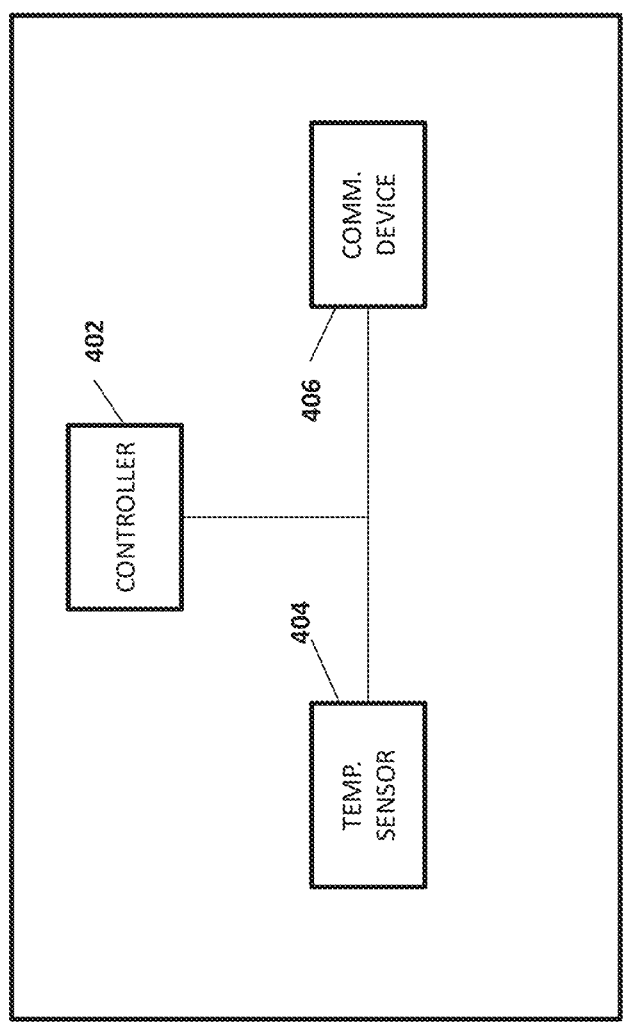
FIG. 4 is a block diagram of the electrical components internal to the battery.

FIG. 4 is a block diagram of electrical circuit components integral with the battery 30. A controller 402 controls the operation of battery. One suitable controller that may be used is the P89LPC925 8-bit microcontroller manufactured by Philips Electronics N.V. of the Netherlands. Battery controller 402 includes a plurality of different sub-circuits which are described in FIG. 5.

Battery 30 also includes a temperature sensor 404 for detecting whether the battery 30 is exposed to autoclave temperatures (e.g., temperatures equal to or exceeding 130 degrees Centigrade). In one embodiment, temperature sensor 404 is a thermistor. Alternatively, temperature sensor 404 may be any suitable temperature sensing device capable of detecting whether or not battery 30 is exposed to autoclave temperatures.

As shown in FIG. 4, the battery may also be provided with a wireless or wired communication device 406. This communication device 406 may be a radio frequency (RF) or infrared (IR) transceiver. In some versions of the invention, the communication device 406 may be a Bluetooth transceiver. When the battery is connected to the tool or charger, communication device 406 exchanges signals with a complementary transceiver within tool 50 (or within another suitable medical device) or within the charger.

Figure 5:
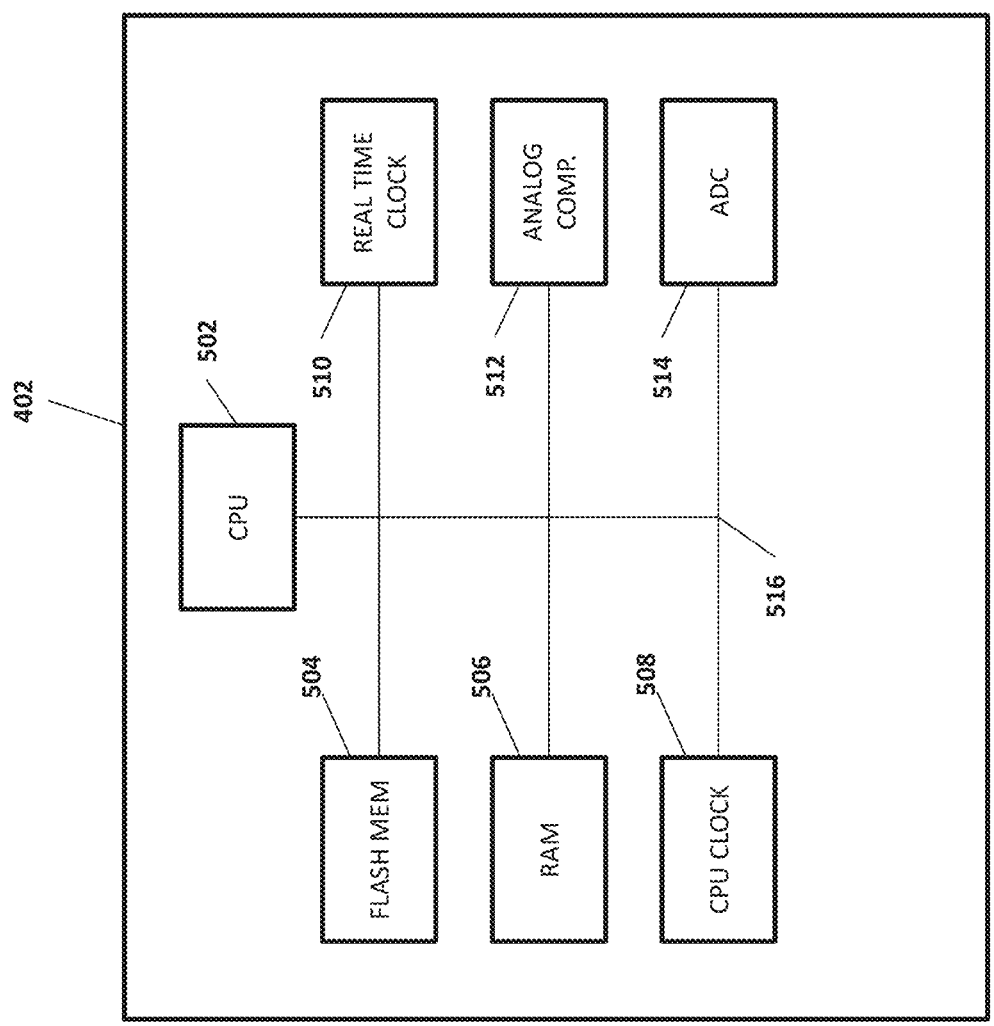
FIG. 5 is a block diagram of various sub-circuits internal to the battery controller.

FIG. 5 is a block diagram illustrating various subcircuits or components of battery controller 402. While the following subcircuits or components are illustrated in FIG. 5 as being included within battery controller 402, it should be recognized that one or more of the subcircuits or components may be included within any suitable device, module, or portion of battery 30.

In an example embodiment, a central processing unit (CPU) 502 controls the operation of battery controller 402 and the components connected to the battery controller. A non-volatile flash memory 504 stores instructions executed by the CPU 502. As described more fully herein, memory 504 also stores the instructions used to regulate the charging of the battery 30, data describing the use history of the battery 30, and data describing the use history of the tool 50 to which the battery 30 is attached.

A random-access memory 506 functions as a temporary buffer for data read and generated by battery controller 402. A CPU clock 508 supplies the clock signal used to regulate the operation of the CPU 502. While shown as single block for purposes of simplicity, it should be appreciated that CPU clock 508 includes an on-chip oscillator as well as sub-circuits that convert the output signal from the oscillator into a CPU clock signal. A real time clock 510 generates a clock signal at fixed intervals as discussed below.

The output signal from the temperature sensor is applied to both an analog comparator 512 and an analog to digital converter (ADC) 514. In FIG. 5, the above sub-circuits are shown interconnected by a single bus 516. It should be appreciated that this is for simplicity. In practice, dedicated lines may connect certain of the sub circuits together. Likewise, it should be understood that battery controller 402 may have other sub-circuits. These sub-circuits are not described in detail.

FIG. 6 is a block diagram of a system 600 including a charging module 602 and a battery 30. In the embodiment shown in FIG. 6, the charging module 602 is a wireless charging module that provides a wireless charging signal to battery 30 to wirelessly charge battery 30. The charging module may alternatively be configured to provide a wired charging signal.

As illustrated in FIG. 6, charging module 602 includes a power supply 604, an antenna 606, a charger controller 608, a memory 610, a charger communication device 612, and one or more indicator devices 614. In one embodiment, charging module 602 is a charging device such as charging device 40 (shown in FIG. 1). In other embodiments, charging module 602 may be a wireless mat, tray, inspection station, or other charging surface that battery 30 may be placed upon to wirelessly charge battery 30. Alternatively, charging module 602 may be embedded in tool 50 or another suitable device. For the sake of simplicity, charging module 602 will be described herein as being a wireless charging device similar to charging device 40.

Power supply 604 converts line current into signals that can be used to energize other components of charging module 602. Power supply 604 also produces a signal that is applied to antenna 606 to enable antenna 606 to provide wireless power to battery 30.

Antenna 606 receives the signal from power supply 604 and converts the signal to a wireless charging signal that is wirelessly transmitted to battery 30. The wireless charging signal is a radio frequency (RF) signal that is receivable by antenna 606 of battery 30. Accordingly, antenna 606 acts as a transmission component that transmits the charging signal to battery 30. In embodiments where charging module 602 does not include an antenna (i.e., in non-wireless embodiments), charging module 602 may use an alternative transmission component, such as power supply 604 or another suitable component, to transmit the charging signal to battery 30.

Charger controller 608 may include a processor that regulates the power supply 604 to provide the signal having a suitable current, voltage, and frequency to the antenna 606. In one embodiment, charger controller 608 is an AT91SAM7X256/128 microcontroller available from Atmel Corporation of San Jose, Calif. Charger controller 608 controls the provision of the charging signal to battery 30 in response to the battery 30 requesting additional charge (referred to herein as a charging request), for example. When charger controller 608 receives a charging request from battery 30, charger controller 608 may determine if battery 30 has a sufficient level of health to be charged. In one embodiment, charger controller 608 compares the battery degradation data stored in memory 610 with a predetermined battery degradation threshold. If the battery degradation data meets or exceeds the predetermined battery degradation threshold, charger controller 608 approves the charging request and commands the power supply 604 to provide the charging signal to battery 30 via antenna 606.

Memory 610 is a computer-readable memory device or unit coupled to charger controller 608. In one embodiment, memory 610 is a non-volatile random-access memory (NOVRAM), such as flash memory. Memory 610 includes charging sequence and charging parameter data that, when executed by charger controller 608, regulates the wireless charging of battery 30. In one embodiment, memory 610 also stores data indicating an amount of degradation of the battery 30. For example, in one embodiment, battery 30 transmits data representative of the amount of degradation of battery 30 to charger communication device 612. Charger communication device 612 transmits the degradation data to charger controller 608 which then stores the data in memory 610.

Charger communication device 612 may be a transceiver which may communicate bi-directionally with battery communication device 624. In one embodiment, charger communication device 612 receives battery degradation data and provides the data to charger controller 608. In addition, charger communication device 612 may receive a charging request from battery 30 and may transmit the charging request to charger controller 608. In an example embodiment, charger communication device 612 is a wireless transceiver that communicates wirelessly with battery communication device 624. Alternatively, in embodiments where the battery 30 includes the data contact 82, the charger communication device 612 is a wired transceiver that communicates with battery communication device 624 via data contact 82.

Indicator devices 614 indicate a status of charging module 602 and/or battery 30. Indicator device 614 may include at least one of a display, a speaker, and a light-emitting diode (LED). The display may be an LCD, LED, or other type of display. In some embodiments, multiple indicators may be used to indicate the status of charging module 602 and/or battery 30. As illustrated in FIG. 6, indicator device 614 is one or more LEDs. In one embodiment, charger controller 608 may activate one or more indicator devices 614 based on the battery degradation data received from battery 30. For example, charger controller 608 may cause an LED to emit a green color (or another suitable color) if the battery degradation data meets or exceeds the predetermined battery degradation threshold. Charger controller 608 may cause an LED to emit a red color (or another suitable color) if the battery degradation data is less than the predetermined battery degradation threshold. Indicator devices 614 thus can indicate to a user the overall degradation status of the battery 30.

As illustrated in FIG. 6, battery 30 includes a plurality of components including battery controller 402 (described above), an antenna 622, one or more cells 32, a battery communication device 624, a gate 626, and a charging circuit 628. Battery 30 may also include a tag 630, such as an NFC or RFID tag that may be used to communicate data with charging module 602 in some embodiments. The battery components described herein may be included within a circuit board, such as circuit board 36 (shown in FIG. 3).

Antenna 622 is configured to receive the wireless charging signal from charging module 602. Specifically, antenna 622 is configured to receive the charging signal from antenna 606 of charging module 602 and is configured to convert the signal to a current that is transmitted to charging circuit 628 for use in charging cells 32.

Cells 32 are used for storing charge within battery 30. In one embodiment, the cells may be high-temperature cells configured to sustain functionality without damage or with reduced damage during sterilization (e.g., during an autoclaving process). The cells may include thermal insulation to minimize damage incurred during sterilization or autoclave cycles. The thermal insulation may comprise an aerogel, such as polyimide, silica, or carbon aerogel. The number and type of cells internal to the battery may of course be different from what is described.

Battery communication device 624 may be a transceiver (e.g., communication device 406) which allows battery controller 402 to connect to tool 50 and/or a computing device, such as a tablet or server. In an embodiment in which battery communication device 624 is a wireless transceiver, battery communication device 624 may wirelessly transmit and receive data using any wireless protocol and/or technology, including but not limited to, ZigBee, Bluetooth, Wi-Fi, etc. Alternatively, battery communication device 624 may be a wired transceiver that transmits data to and from tool 50 and/or a computing device using a suitable wired protocol. A user may send and/or receive data from battery 30 and/or tool 50 using battery communication device 624.

Battery communication device 624 may transmit authentication data to a medical device communication module (not shown) and/or may receive authentication data from the medical device communication module to authenticate tool 50 and/or battery 30. Accordingly, battery 30 and/or tool 50 may ensure that only authorized or compatible components are being used with each other.

Gate 626 includes one or more circuit components that selectably couple cells 32 to contacts 78 and 80. In one embodiment, gate 626 includes one or more transistors, such as field effect transistors, that are activatable by battery controller 402 to electrically couple cells 32 to contacts 78 and 80 such that cells 32 are selectively in communication with cathode contact 78 and anode contact 80.

Charging circuit 628 includes one or more circuit components that facilitate charging, or providing charge or current to, cells 32. In one embodiment, when battery 30 receives a charging signal from a charging module or device, antenna 622 converts the charging signal to a current that is provided to charging circuit 628. Accordingly, in embodiments where battery 30 includes antenna 622, charging circuit 628 receives the charging signal from the charging module or device through antenna 622. In embodiments where battery 30 is directly connected to the charging module or device (i.e., in non-wireless embodiments), charging circuit 628 may receive the charging signal directly from the charging device or module via contacts 78 and 80.

Charging circuit 628 may receive the current and may adjust the current and/or voltage to conform to a desired current or voltage of cells 32. When the cells 32 have been charged to a maximum or predefined state of charge, battery controller 402 may control charging circuit 628 to prevent further current from being provided to cells 32.

In one embodiment, battery communication device 624 may include a tag 630 for use in communicating with charging module 602. Alternatively, tag 630 may be coupled to battery communication device 624 or may be a standalone component with an integrated antenna (not shown). In some embodiments, battery degradation data, such as a determined amount of degradation of battery 30, may be stored in tag 630 and may be transmitted to charging module 602 via NFC, RFID, or any other suitable communication protocol.

The various components of battery 30 are positioned within a housing 632. The housing 632 may include a cover 634 that may be welded to the housing 632 to form a unitary structure to form a seamless bond. In addition, a seal 636 may be positioned between housing 632 and cover 634 to form a hermetic barrier between cover 634 and housing 632. Seal 636 may be formed of a material that is autoclaveable and, optionally, compressible. For example, seal 636 may comprise EPDM rubber or silicon rubber.

Contacts 78 and 80 may be mounted to cover 634. While contacts 78 and 80 are illustrated in FIG. 6 as extending from cover 634 and exposed, it should be recognized that contacts 78 and 80 may be partially or completely housed within cover 634 and/or housing 632 such that a corresponding contact from tool 50 inserts into cover 634 and/or housing 632 to connect to contact 78 and contact 80. Contact 78 is sometimes referred to as a cathode contact. Contact 80 is sometimes referred to as an anode contact. Contacts 78 and 80 (and cover 634) are shaped and physically adapted to enable battery 30 to removably couple to tool 50. More specifically, contacts 78 and 80 are physically adapted to be inserted into a corresponding portion of tool 50 to establish physical and electrical connection with tool 50. Thus, when cathode contact 78 and anode contact 80 are inserted into tool 50 and contacts 78 and 80 are activated such that a voltage is applied across anode contact 80 and cathode contact 78, battery 30 provides power to tool 50.

The housing of the battery may comprise a material suitable for autoclave cycles, including, but not limited to, polyether ether ketone, polyetherimide, polyphenylsulfone, etc. The battery assembly, including the battery components, housing 632, and cover 634, is configured to be sterilized, together or separate from the tool, via steam sterilization, hydrogen peroxide sterilization, or other suitable sterilization technique. By "sterile," it is meant that, once the process is complete, the housing 632 or cover 634 has a sterilization assurance level (SAL) of at least $10^{-6}$. This means that there is equal to or less than one chance in a million that a single viable microorganism is present on the sterilized item. This definition of sterile is the definition set forth in the ANSI/AAMI ST35-1966, entitled "Safe Handling and Biological Decontamination of Medical Devices in Health Care Facilities and Nonclinical Settings". For alternative applications, the "sterilization" process is sufficient if, once the process is complete, the housing 632 or cover 634 has an SAL of at least $10^{-4}$.

Also while many versions of the battery of this invention include a housing 632 or cover 634 that is autoclaveable, that need not always be the case. This feature is often not part of the design for a battery of that is not designed for medical/surgical use. Likewise, the features of this battery may be incorporated into what is often referred to as aseptic battery. An aseptic battery includes a cell cluster and a circuit board to which the electrical components such as the cell regulator (voltage regulator), the transistors (e.g., FETS), the resistors, capacitors, and microprocessor or battery controller are monitored. This cell cluster is not autoclaveable. Instead, the cell cluster can be removably fitted into a housing that is autoclaveable. Once the cell is fitted in the housing, the housing is sealed. The cells and other cluster-forming components are thus encapsulated in a sterilized enclosure. Contacts integral with both the cell cluster and the housing provide the contact path over which current is sourced from the battery. A further understanding of the structure of an aseptic battery assembly can be obtained from U.S. Pat. No. 7,705,559, entitled "ASEPTIC BATTERY WITH A REMOVAL CELL CLUSTER, THE CELL CLUSTER CONFIGURED FOR CHARGING IN A SOCKET THAT RECEIVES A STERILIZABLE BATTERY" and PCT Pub. No. WO 2007/090025 A1, entitled "ASEPTIC BATTERY ASSEMBLY WITH REMOVABLE, RECHARGEABLE BATTERY PACK, THE BATTERY PACK ADAPTED TO BE USED WITH A CONVENTIONAL CHARGER", the disclosures of which are incorporated herein by reference.

Some batteries are also provided with supplemental components. These components may include internal sensors, data collection circuits, memories or control processors. These components may monitor the environment to which the battery is exposed, store data regarding the use of the battery, and/or store data regarding the medical device to which the battery is attached. The supplemental components may include or be similar to the supplemental components described in U.S. Pat. No. 6,018,227, entitled "BATTERY CHARGER ESPECIALLY USEFUL WITH STERILIZABLE RECHARGEABLE BATTERY PACKS", and U.S. Pat. Pub. No. 2007/0090788/PCT Pub. No. WO 2007/050439 A2, entitled "SYSTEM AND METHOD FOR RECHARGING A BATTERY EXPOSED TO A HARSH ENVIRONMENT", and U.S. Pat. No. 9,219,375, entitled, "BATTERY CAPABLE OF WITHSTANDING THE EFFECTS OF LIQUID SUBMERSION", the disclosures of which are incorporated herein by reference. When a battery is provided with one or more of these supplemental components, the battery housing may include a supplemental contact (e.g., contact 82). This supplemental contact may be the contact through which signals are received from and/or transmitted to the supplemental components.

Figure 7:
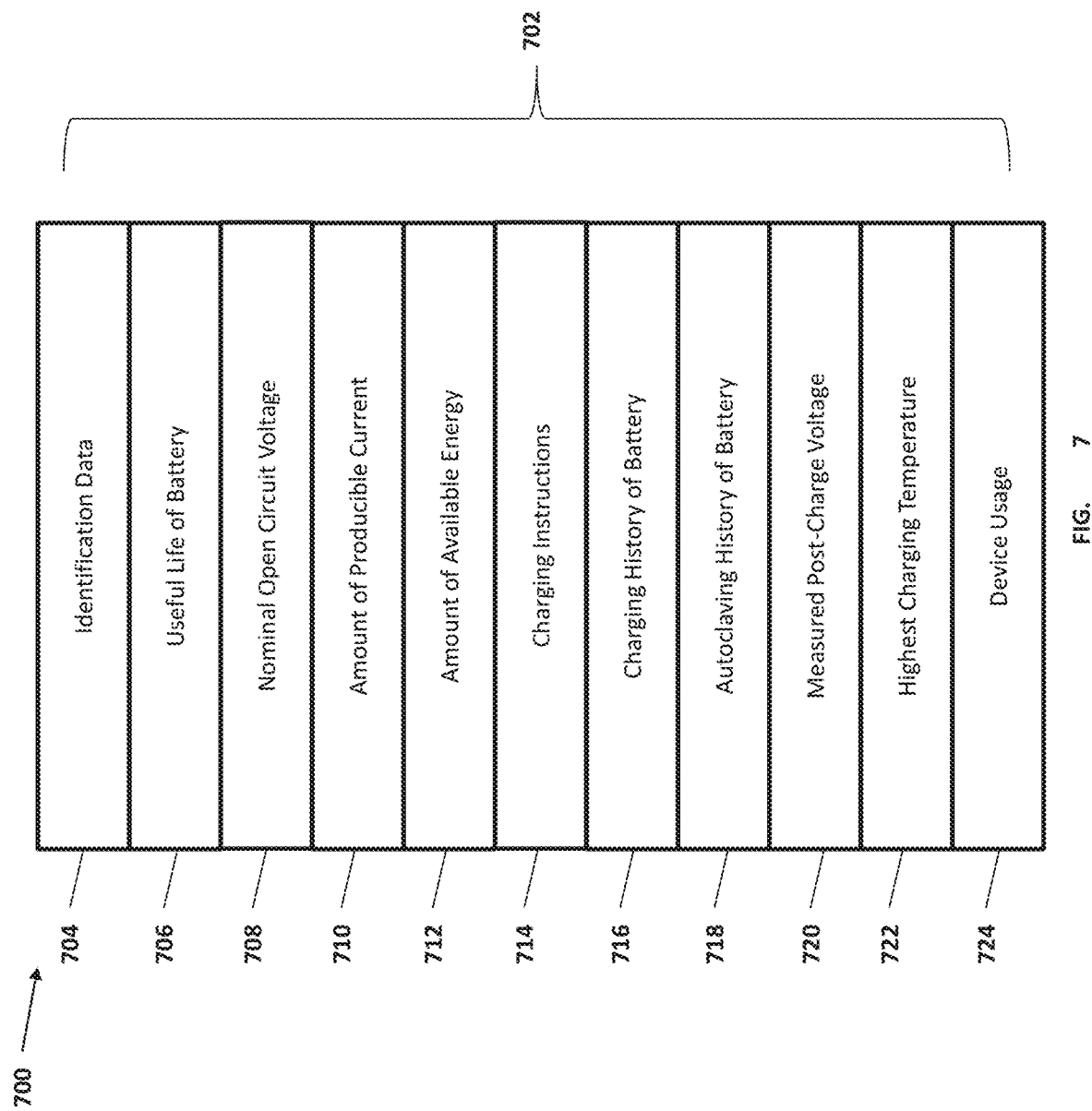
FIG. 7 is a block diagram of an example data structure that may be stored in a memory of the battery controller.

FIG. 7 is a block diagram of a data structure 700 that may be stored in flash memory 504 (shown in FIG. 5) in addition to the instructions executed by the battery controller 402. The data structure 700 may store data as one or more fields 702 in one or more records or files. As one example, identification data 704 may be stored in the file and may be used to identify the battery. The identification data 704, may include, for example, a serial number, a lot number, a manufacturer identification, and/or an authorization code. The authorization code or other identification information may be read by the tool 50 or charger 40 to which the battery is connected to authenticate the battery (e.g., to determine if, respectively the battery can power the tool or be recharged by the charger). The flash memory 504 may also include a field indicating the useful life 706 of the battery (sometimes referred to as "useful life data"). Useful life data may include one or more of the following data types: battery expiration data, a number of charging cycles that the battery has undergone, and a number of autoclaving procedures or cycles the battery has been subjected to. Other fields may indicate the nominal open circuit voltage 708 of the signal produced by the battery, the current 710 the battery can produce, and the amount of available energy 712 (represented in joules, for example).

Charging instructions 714 for the battery may be stored in a field. This data can include the types of data described in the memories of the batteries disclosed in U.S. Pat. Nos. 6,018,227 and 6,184,655, the disclosures of which are hereby incorporated by reference.

Flash memory 504 also contains data describing a charging history 716 and autoclave history 718 of the battery. For example, as part of the charging history 716 of the battery 30, data may be stored indicating the number of times the battery was charged as well as a timestamp indicating the time each charging cycle was initiated and/or ended. A current taper time (discussed more fully herein) of the battery 30 may also be stored for each charging cycle that the battery 30 received as well in some embodiments. In addition, a baseline current taper time may be stored in charging history 716 or in another suitable portion of flash memory 504. The baseline current taper time may be stored by the battery controller 402 (or another suitable controller or processor) after the battery 30 has completed an initial validation test or when battery 30 undergoes its first charging cycle.

As part of the autoclaving history 718 of battery 30, flash memory 504 may store data indicating the total number of times the battery has been autoclaved, and/or a cumulative amount of time the battery 30 has been subjected to temperatures at or above a threshold considered to be the autoclave temperature. In one embodiment, the threshold temperature is about 130 degrees centigrade. In a more specific embodiment, the threshold temperature is about 134 degrees centigrade. The autoclaving history 718 field may also include data indicating the number of times and/or the cumulative amount of time the battery has been exposed to potentially excessive autoclaving cycles. The autoclaving history 718 may also include peak autoclave temperature data indicating the highest autoclave temperature to which the battery 30 has been exposed and an amount of time the battery 30 has been in an autoclave for each of its autoclaving cycles, as well as a period of the longest single time the battery was subjected to autoclaving. In some embodiments, the autoclaving history 718 may be used, along with the current taper time, to determine the amount of degradation of battery 30 and/or may be used to determine a degradation score of battery 30.

A measured post-charge voltages field 720 contains data indicating the measured voltages-at-load of the battery after each charging. In some embodiments, field 720 only contains these measurements for the last 1 to 10 charging cycles. In another field 722, data is stored indicating the highest battery temperature measured during its previous charging cycles. Again, field 722 may only contain data indicating the highest temperatures measured during the last 1 to 10 charging cycles of the battery.

Flash memory 504 also contains a device usage field 724. As discussed below, device usage field 724 stores data obtained from the tool 50 or other medical device that battery 30 is employed to power. For example, in one embodiment, device usage field 724 may store data indicating a number of times that the battery 30 has been connected to tool 50, a number of trigger pulls of tool 50, a total amount of time that the battery has provided power to tool 50 during an operation of tool 50 (i.e., a runtime of tool 50), a number of power cycles that tool 50 has undergone, a maximum temperature tool 50 has been exposed to, a current consumption of tool 50, a speed histogram of tool 50, a list of serial numbers or other identifiers of the devices that battery 30 has interacted with, and/or any other suitable data of tool 50. It should be understood, however, that the device usage field 724 does not include patient data. The data stored in device usage field 724 may be transmitted by a communication module of medical device 50 and received by battery communication device 624.

Figure 8:
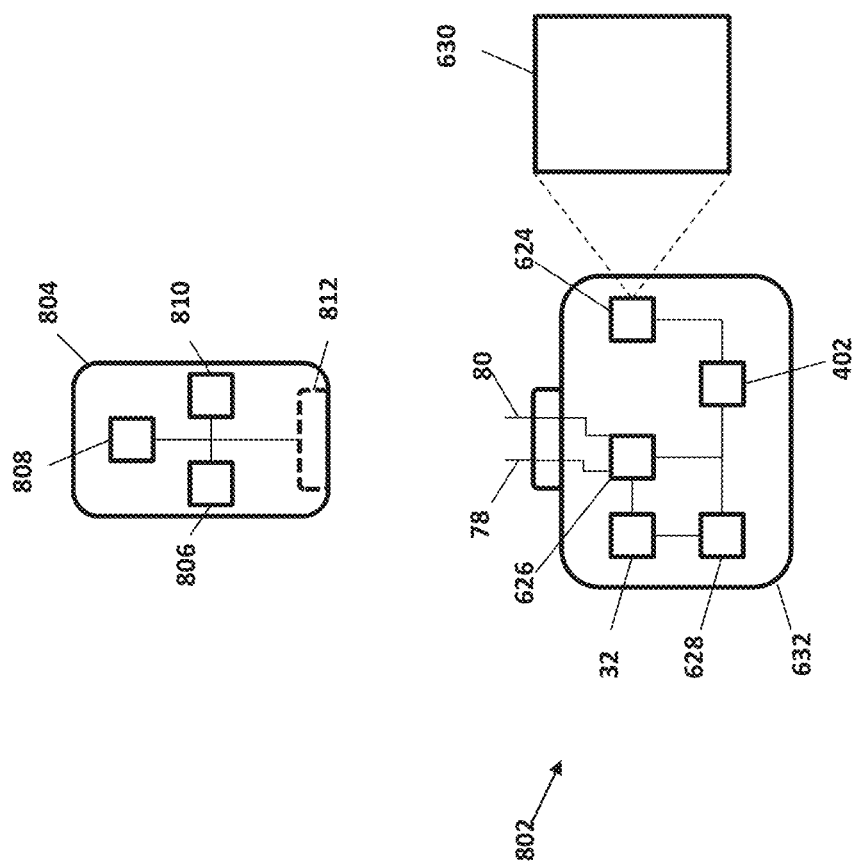
FIG. 8 is a block diagram of an example wireless attachment and a battery.

FIG. 8 is a block diagram of an example system 800 that includes a battery 802 and a wireless attachment 804 (hereinafter referred to as a dongle). In the illustrated embodiment, battery 802 may not include any native ability to receive wireless charging signals, such as the wireless charging signals transmitted by charging module 602 (shown in FIG. 6). Accordingly, a wireless dongle 804 may be provided to removably attach to battery 802 and enable wireless charging signals to be received by dongle 804. The wireless dongle 804 may then convert the wireless charging signals to currents that may be provided to battery 802 as described more fully herein.

In one embodiment, battery 802 is substantially similar to battery 30 except that battery 802 may not include an antenna configured to receive wireless charging signals from charging module 602. In a further embodiment, battery 802 may be an aseptic battery that does not include an autoclaveable cover or a seal for sterilizing the battery 802. In other respects, battery 802 may be similar to battery 30 unless otherwise specified.

In the embodiment illustrated in FIG. 8, dongle 804 includes an antenna 806, a processor 808, and a communication device 810. Dongle 804 also includes an attachment portion 812 that is configured to mate with contacts 78 and 80 of battery 802.

Antenna 806 is configured to receive a wireless charging signal from antenna 606 of charging module 602. Specifically, antenna 806 is configured to receive the charging signal and is configured to convert the signal to a current that is transmitted to battery 802 for use in charging cells 32.

Dongle processor 808 controls the transmission of the current from the antenna 806 to attachment portion 812 and contacts 78 and 80. Dongle processor 808 may also control the communication between charging module 602 and battery 802 using communication device 810 in some embodiments.

Dongle communication device 810 may be a transceiver which enables dongle 804 to connect to charging module 602, battery 802, and/or other computing devices. In an embodiment in which communication device 810 is a wireless transceiver, communication device 810 may wirelessly transmit and receive data using any wireless protocol and/or technology, including but not limited to, ZigBee, Bluetooth, Wi-Fi, etc.

Attachment portion 812 is physically adapted to mate to the portion of battery 802 including contacts 78 and 80. Specifically, attachment portion 812 includes internal contacts (not shown) that electrically couple to contacts 78 and 80 when dongle 804 is attached to battery 802. Accordingly, attachment portion 812 enables the current provided by antenna 806 to be transmitted to battery 802 via contacts 78 and 80 when dongle 804 is coupled to battery 802. Thus, dongle 804 enables wireless charging signals from charging module 602 to be provided to battery 802, enabling battery 802 to be charged thereby.

Figure 9:
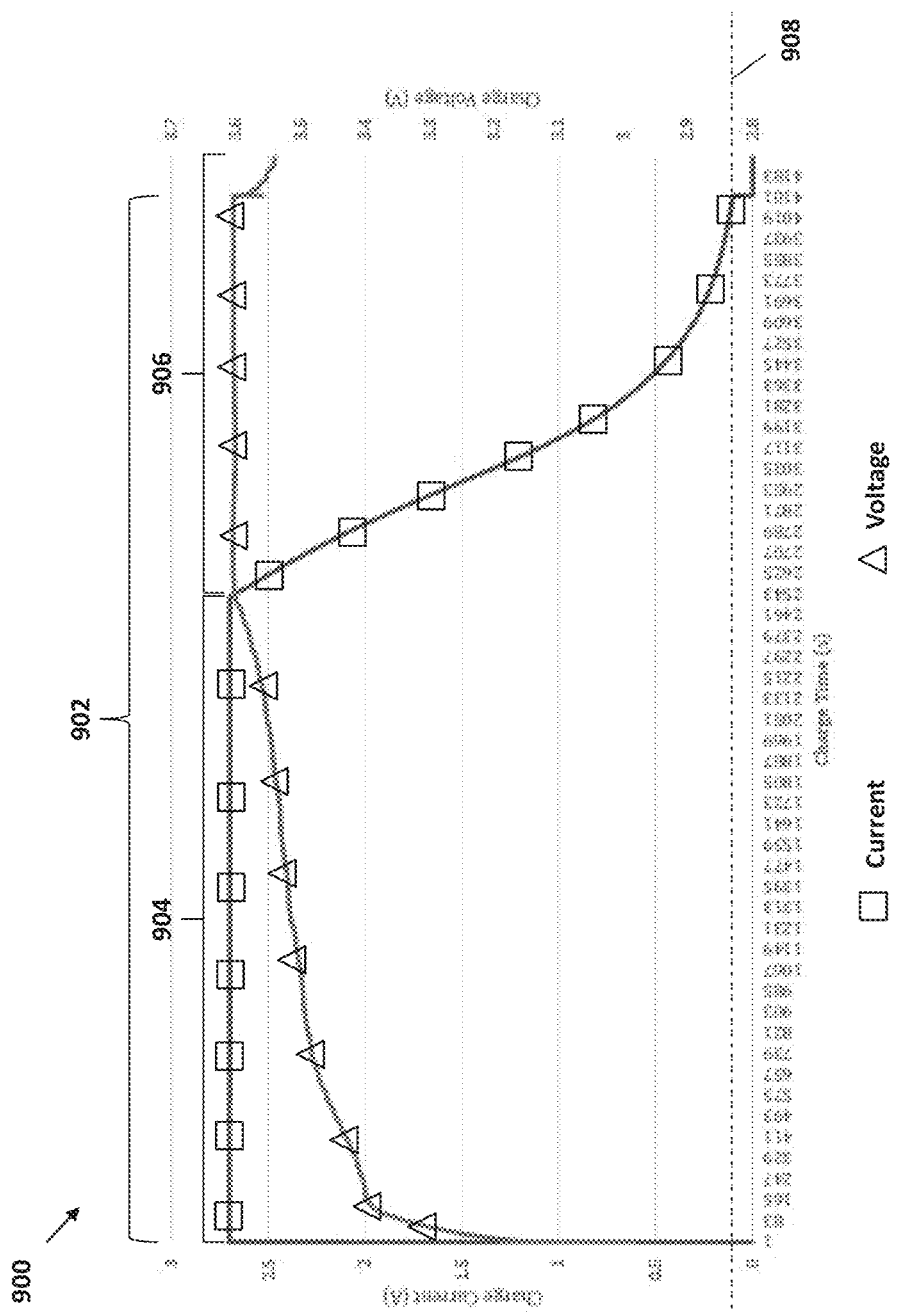
FIG. 9 is a chart illustrating an example charging cycle for a battery.

FIG. 9 is a graph 900 illustrating an example charging cycle 902 that may be applied to battery 30 (or battery 802).

In the embodiment illustrated in FIG. 9, charging cycle 902 includes a constant current phase 904 and a constant voltage phase 906. During the constant current phase 904, cells 32 are charged with a constant current at a potentially variable voltage using the charging signal received from battery antenna 622 (or from dongle 804 in some embodiments). More specifically, charging circuit 628 of battery 30 receives the charging signal and adjusts the current and voltage of the signal to maintain the current provided to cells 32 at a constant amplitude.

When the cells 32 reach a predetermined level of charge, the charging cycle 902 switches to the constant voltage phase 906. During the constant voltage phase 906, cells 32 are charged with a potentially variable current at a constant voltage using the charging signal. Specifically, charging circuit 628 of battery 30 receives the charging signal and adjusts the current and voltage of the signal to maintain the voltage provided to cells 32 at a constant amplitude.

During the constant voltage phase 906, battery controller 402 monitors the current provided to the battery cells 32 and calculates a current taper time based on the current. Specifically, in one embodiment, battery controller 402 records a time at which the constant voltage phase 906 is initiated (referred to as the current taper start time) and records a time at which the current provided to the cells 32 drops below a predetermined current threshold 908 (referred to as the current taper end time). Battery controller 402 may record the current taper start time and the current taper end time for each charging cycle 902 in flash memory 504 or in another suitable memory. In one embodiment, the predetermined current threshold 908 is a predetermined percentage, such as 10%, of the amplitude of the current provided during the constant current phase 904 or 10% of the amplitude of the current provided at the start of the constant voltage phase 906. In another embodiment, the predetermined current threshold 908 is a predetermined value, such as 0.3 amps. Alternatively, the predetermined current threshold 908 may be set to be any suitable value as desired. The predetermined current threshold 908 may be set by battery controller 402 or by another suitable device that transmits or writes the current threshold value to memory 504 via battery communication device 624.

Once the current has dropped below the predetermined current threshold 908, battery controller 402 calculates the current taper time by subtracting the current taper start time from the current taper end time. Battery controller 402 stores the current taper time value in flash memory 504 or any other suitable memory.

After the constant current phase 904 ends, the battery 30 (i.e., cells 32) is determined to be at 100% state of charge. Battery controller 402 may then determine an amount of degradation that the battery 30 has experienced. For example, in one embodiment, the battery controller may determine an amount of degradation to be high or otherwise unacceptable if the current taper time equals or exceeds a current taper time threshold value. The battery controller 402 may determine the amount of degradation of the battery to be low or otherwise acceptable if the current taper time does not exceed the predetermined current taper time threshold value.

The current taper time threshold may be based on an acceptable increase in the current taper time from a baseline current taper time. The battery controller 402 may store the baseline current taper time in flash memory 504, for example, after the battery 30 has completed an initial validation test, or when battery 30 undergoes its first charging cycle. As the battery 30 degrades, the current taper time generally increases. As a result, the battery controller 402 may set the current taper time threshold value to a predetermined value above the baseline current taper time. Alternatively, the current taper time threshold value may be set to a value that is a predetermined percentage above the baseline current taper time.

Additionally, or alternatively, battery controller 402 may determine a degradation rating or score (e.g., a rating or score between 1 and 10 or another suitable range) for the battery based at least in part on the current taper time. In addition to the current taper time, the battery degradation score may be based on an autoclave history of the battery 30, the charging history of the battery, and/or any other suitable data or history of the battery 30. Battery controller 402 may use a look-up table or another suitable data structure or algorithm to determine the degradation score based on the current taper time and/or based on any other suitable data of battery 30. In a specific embodiment, battery controller 402 may determine the degradation rating based on a percentage or amount that the current taper time has increased above the baseline current taper time.

It should be noted that, while the amount of degradation of the battery has been described as being determined by battery controller 402, the degradation amount can alternatively or additionally be determined by charger controller 608 and/or dongle processor 808 based on data (e.g., the current taper time, etc.) provided by battery controller 402.

Other data in addition to the current taper time may be used to determine the battery degradation amount. For example, a state of charge of the battery, a maximum temperature the battery has been subjected to, a minimum voltage output by the battery, an ambient pressure the battery has been subjected to, a humidity the battery has been subjected to, and a failure condition the battery has experienced may be used in addition to the current taper time to determine the amount of degradation of battery 30.

Battery controller 402 may activate an LED (not shown) or another suitable visual indicator based on the determined battery degradation amount. Additionally or alternatively, battery controller 402 may use battery communication device 624 to transmit data representative of the battery degradation amount to charging module 602 to enable charging module 602 to visually indicate the battery degradation (e.g., by activating one or more indicator devices 614 as described above). Alternatively still, the battery controller 402 may use battery communication device 624 to transmit data representative of the battery degradation amount to an external server, such as those maintained at the manufacturer or hospital administration to enable centralized tracking of the condition of a fleet of batteries.

Figure 10:
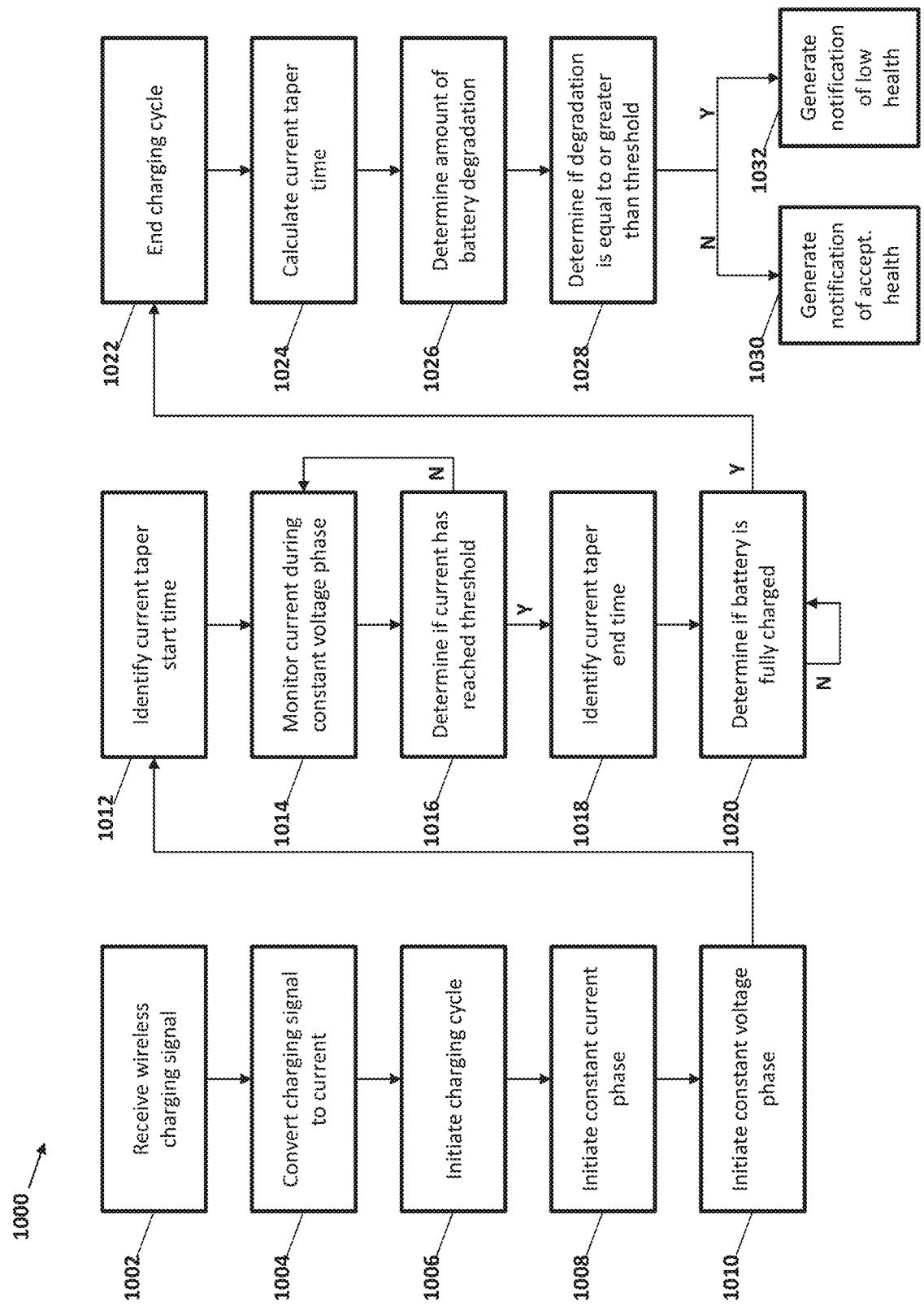
FIG. 10 is a flowchart of an example method of determining an amount of degradation of a battery.

FIG. 10 is a flowchart of an example embodiment of a method 1000 of determining an amount of degradation of a battery, such as battery 30 or battery 802. As shown in FIG. 10, the method 1000 includes steps 1002-1032. One or more of the steps 1002-1032 of the method 1000 may be embodied as computer-executable instructions stored in a memory of battery 30, battery 802, or charging module 602 and may be executed by a processor or controller, such as charger controller 608 of charging module 602 or by battery controller 402.

In the example embodiment of FIG. 10, battery 30 and charging module 602 may be placed within a proximity (i.e., within wireless range) of one another and charging module 602 may transmit a charging request to charging module 602. In response, charging module 602 may transmit a wireless charging signal that is received by battery 30 during step 1002.

Antenna 622 of battery 30 receives the wireless charging signal and, during step 1004, converts the signal to a current that is provided to charging circuit 628. During step 1006, battery controller 402 may initiate a charging cycle by transmitting one or more signals to charging circuit 628. Specifically, during step 1008, battery controller 402 may transmit signals to charging circuit 628 to cause the circuit to initiate a constant current phase. During the constant current phase of step 1008, charging circuit 628 charges cells 32 with a constant current at a changeable voltage. After the constant current phase has completed, battery controller 402 may transmit signals to charging circuit 628 to cause the circuit to initiate a constant voltage phase of the charging cycle during step 1010. During the constant voltage phase of step 1010, charging circuit 628 charges cells 32 with a changeable current at a constant voltage.

Battery controller 402 then identifies, during step 1012, a current taper start time to be the time that the constant voltage phase is initiated. During step 1014, battery controller 402 monitors the current provided to cells 32 during the constant voltage phase and determines whether the current has reached or dropped below a predefined current threshold during step 1016. If the current has not reached or dropped below the threshold, battery controller 402 continues monitoring the current during the constant voltage phase during step 1014. If the current has reached or dropped below the threshold, battery controller 402 identifies a current taper end time to be the time that the current reached or dropped below the threshold during step 1018.

If battery controller 402 determines, during step 1020, that the battery has been fully charged (i.e., reached a full state of charge), battery controller 402 ends the charging cycle by transmitting a signal to charging circuit 628 to cause charging circuit 628 to stop providing charging current to cells 32 during step 1022. Battery controller 402 (and/or another processor or controller, such as charger controller 608) may calculate the current taper time by subtracting the current tape start time from the current taper end time during step 1024. Battery controller 402 (and/or another processor or controller) may then use the current taper time to determine an amount of degradation of battery 30 during step 1026. In one embodiment, the amount of degradation of battery 30 is equal to, or otherwise based on, the current taper time minus a baseline current taper time described above. In other embodiments, the amount of degradation of battery 30 is equal to, or otherwise based on, the current taper time itself. The amount of degradation may be at least partially due to damage accrued by the battery undergoing one or more sterilization processes, such as one or more autoclaving processes.

Battery controller 402 (and/or another suitable processor or controller, such as charger controller 608) may determine, during step 1028, if the amount of degradation is equal to or greater than a predetermined degradation threshold. The predetermined degradation threshold may be the current taper time threshold described above. In other embodiments, the predetermined degradation threshold may be any other suitable value based on the baseline current taper time and/or the current taper time threshold. In a specific embodiment, the amount of degradation is determined to be high if the current taper time is equal to or greater than the threshold, and the amount of degradation is determined to be low if the current taper time is less than the threshold. If the amount of degradation is less than the threshold, battery 30 (or dongle 804 or charging module 602) may generate a notification that the battery has an acceptable or low level of degradation during step 1030. Conversely, if the amount of degradation is greater than or equal to the threshold, battery 30 (or dongle 804 or charging module 602) may generate a notification that the battery has an unacceptable or high amount of degradation during step 1032. The notifications may be generated using one or more LEDs or other visual indicator devices on battery 30, dongle 804, and/or charging module 602. In one embodiment, the predetermined degradation threshold may be selected based on a minimum amount of charge needed to perform a surgical operation using the medical device. For example, the degradation threshold may be correlated with an amount of charge needed to power the medical device for a predetermined amount of time, such as 5 minutes, 10 minutes, 30 minutes, or another suitable amount of time needed to complete a surgical operation.

It should again be noted that the method 1000 of determining an amount of degradation of a battery, such as battery 30 or battery 802, advantageously does not require battery 30, 802 to undergo a separate, active battery test in which current is diverted through an external resistor (e.g., located within a charging device) to determine the impedance of battery 30, 802. Rather, the embodiments described herein provide a passive approach to monitoring battery degradation in that the battery controller 402 monitors the current provided to the battery cells during a constant voltage stage of the battery charging cycle. Thus, battery controller 402, charger controller 46, or charger controller 608 may determine an amount of battery degradation when no physical connection to an external resistor is provided, such as during a wireless charging cycle.

Although specific features of various embodiments of the disclosure may be shown in some drawings and not in others, this is for convenience only. In accordance with the principles of the disclosure, any feature of a drawing or other embodiment may be referenced and/or claimed in combination with any feature of any other drawing or embodiment.

This written description uses examples to describe embodiments of the disclosure and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of determining an amount of degradation of an autoclavable lithium battery for a medical device, the method comprising:
    providing an autoclavable lithium battery for a medical device;
    receiving a charging signal from a charging device;
    initiating a charging cycle to charge a cell of the battery based on the charging signal, the charging cycle comprising a constant current phase and a constant voltage phase;
    determining a first time at which the constant voltage phase begins;
    monitoring a current provided to the cell during at least a portion of the constant voltage phase;
    determining a second time at which the current provided during the constant voltage phase reaches a predetermined threshold;

calculating a current taper time based on the difference between the second time and the first time; and determining an amount of degradation of the battery based on the current taper time.

2. The method of claim 1, wherein determining the amount of degradation of the battery is based on the current taper time and at least one factor selected from the group consisting of a state of charge of the battery, a maximum temperature the battery has been subjected to, a minimum voltage output by the battery, an ambient pressure the battery has been subjected to, a humidity the battery has been subjected to, and a failure condition the battery has experienced.

3. The method of claim 1, wherein receiving the charging signal from a charging device comprises receiving a wireless charging signal from the charging device.

4. The method of claim 1, wherein the amount of degradation occurs at least partially due to autoclaving the battery.

5. The method of claim 1, wherein the battery includes a battery controller, and wherein the battery controller determines the amount of degradation of the battery based on the current taper time.

6. The method of claim 1, wherein the charging device includes a charger controller, and wherein the charger controller determines the amount of degradation of the battery based on the current taper time.

7. An autoclavable lithium battery for a medical device, the battery comprising:
- a cell for storing a charge;
- a charging circuit configured to receive a charging signal from a charging device and to responsively initiate a charging cycle to charge the cell, wherein the charging cycle comprises a constant current phase and a constant voltage phase;
- a battery controller coupled to the charging circuit, the battery controller configured to:
  - determine a first time at which the constant voltage phase begins;
  - monitor a current provided to the cell during at least a portion of the constant voltage phase;
  - determine a second time at which the current provided during the constant voltage phase reaches a predetermined threshold;
  - calculate a current taper time based on the difference between the second time and the first time; and
  - determine an amount of degradation of the battery based on the current taper time.

8. The autoclavable lithium battery of claim 7, wherein the battery controller is configured to determine the amount of degradation of the battery based on at least one of a state of charge of the battery, a maximum temperature the battery has been subjected to, a minimum voltage output by the battery, an ambient pressure the battery has been subjected to, a humidity the battery has been subjected to, and a failure condition the battery has experienced, in addition to the current taper time.

9. The autoclavable lithium battery of claim 7, wherein the charging circuit is configured to receive a wireless charging signal from the charging device.

10. The autoclavable lithium battery of claim 7, further comprising a communication device configured to transmit data representative of the determined amount of degradation to the charging device.

11. A system, comprising:
- an autoclavable lithium battery for a medical device; and
- a module for charging the battery, the module comprising:
  - a module controller; and
  - a transmission component configured to provide a charging signal to the battery, wherein the battery comprises:
    - a cell for storing a charge;
    - a charging circuit configured to receive the charging signal from the module and to responsively initiate a charging cycle to charge the cell, wherein the charging cycle comprises a constant current phase and a constant voltage phase;
    - a battery controller coupled to the charging circuit, the battery controller configured to monitor a current provided to the cell during at least a portion of the constant voltage phase,
- wherein one of the module controller and the battery controller is configured to:
  - determine a first time at which the constant voltage phase begins;
  - determine a second time at which the current provided during the constant voltage phase reaches a predetermined threshold;
  - calculate a current taper time based on the difference between the second time and the first time; and
  - determine an amount of degradation of the battery based on the current taper time.

12. The system of claim 11, wherein the module is one of a charging device, a surgical handpiece, and a wireless charging tray.

13. The system of claim 11, wherein the one of the module controller and the battery controller is configured to determine the amount of degradation of the battery based on at least one of a state of charge of the battery, a maximum temperature the battery has been subjected to, a minimum voltage output by the battery, an ambient pressure the battery has been subjected to, a humidity the battery has been subjected to, and a failure condition the battery has experienced, in addition to the current taper time.

14. The system of claim 11, wherein the charging circuit is configured to receive a wireless charging signal from a charging device.

15. The system of claim 11, wherein the battery further comprises a communication device, and wherein the battery controller determines the amount of degradation and transmits data representative of the determined amount of degradation to the module using the communication device.

16. The system of claim 15, wherein the module comprises at least one light emitting diode (LED), and wherein the module activates the at least one LED based on the data representative of the determined amount of degradation received from the communication device.

17. The system of claim 15, wherein the module is configured to determine whether to provide a subsequent charging signal to the battery based on the data representative of the determined amount of degradation.

* * * * *